(12) United States Patent
Arafa et al.

(10) Patent No.: US 6,294,823 B1
(45) Date of Patent: Sep. 25, 2001

(54) INTEGRATED CIRCUIT WITH INSULATING SPACERS SEPARATING BORDERLESS CONTACTS FROM THE WELL

(75) Inventors: Mohamed Arafa, Hillsboro; Scott Thompson, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/310,467

(22) Filed: May 12, 1999

(51) Int. Cl.[7] ................................................. H01L 29/00
(52) U.S. Cl. .......................... 257/510; 438/221; 438/634
(58) Field of Search .................................. 257/770, 401, 257/403, 377, 510, 499, 506; 438/221, 223, 392, 637, 399, 301, 248, 655, 667, 682, 757, 400, 634, 778, 791, 700

(56) References Cited

U.S. PATENT DOCUMENTS

| 4,966,870 | 10/1990 | Barber et al. . |
| 5,268,330 | 12/1993 | Givens et al. . |
| 5,348,905 | * 9/1994 | Kenney ................................. 438/247 |
| 5,466,636 | * 11/1995 | Cronin et al. ......................... 438/392 |
| 5,633,202 | 5/1997 | Brigham et al. . |
| 5,652,176 | 7/1997 | Maniar et al. . |
| 5,926,693 | * 7/1999 | Gardner et al. ......................... 438/67 |
| 5,972,758 | * 10/1999 | Liang ..................................... 438/294 |
| 6,090,671 | 7/2000 | Balasubramanyam et al. . |
| 6,093,619 | * 7/2000 | Huang et al. .......................... 438/400 |
| 6,096,642 | * 8/2000 | Wu ......................................... 438/655 |

* cited by examiner

Primary Examiner—Don Wong
Assistant Examiner—Ephrem Alemu
(74) Attorney, Agent, or Firm—Mark Seeley

(57) ABSTRACT

An improved integrated circuit and method for making it are described. The integrated circuit includes a shallow trench isolation structure formed adjacent to a well. A borderless contact makes electrical contact to a conductive region formed on the well and an insulating spacer is formed adjacent to a sidewall of the conductive region.

9 Claims, 5 Drawing Sheets

US 6,294,823 B1

INTEGRATED CIRCUIT WITH INSULATING SPACERS SEPARATING BORDERLESS CONTACTS FROM THE WELL

FIELD OF THE INVENTION

The present invention relates to integrated circuits and a method for making them.

BACKGROUND OF THE INVENTION

To continue adding transistors to integrated circuits without significantly increasing die sizes, the distance between transistors and other devices may have to be reduced. The need to reduce the distance between devices may require reducing the width of the landing area for the contacts. As a result, when contact is made to the landing area, part of the contact may extend laterally over the isolation structure, forming a borderless contact. To prevent the contact etch step from etching into the isolation structure, an etch stop layer may be formed on the surface of the device prior to performing the contact etch. Such a layer may comprise silicon nitride.

Processes that add such an etch stop layer require extra steps, e.g., an extra nitride layer deposition step and a two step contact etch. Moreover, where such a nitride etch stop layer is formed over a silicide, the nitride must be deposited at a relatively low temperature to maintain junction and silicide integrity. Depositing nitride using a low temperature process may, however, adversely affect a device's reliability. In addition, when a relatively thick nitride layer is used to form the etch stop, e.g., to ensure the contact etch will not completely remove that layer, that layer may require devices to be spaced further apart. Requiring additional spacing to accommodate a thick nitride layer may diminish the reduced spacing benefit that borderless contacts may otherwise provide.

Accordingly, there is a need for a method for making borderless contacts that either eliminates altogether the need to form a silicon nitride etch stop layer after silicide formation, or allows for the use of a thinner nitride etch stop layer.

SUMMARY OF THE INVENTION

The present invention covers an integrated circuit comprising a shallow trench isolation structure formed adjacent to a well, a borderless contact making electrical contact to a conductive region formed on the well, and an insulating spacer formed adjacent to a sidewall of the conductive region. The present invention also covers a method of forming such an integrated circuit.

DETAILED DESCRIPTION OF THE PRESENT INVENTION

Figure 1:
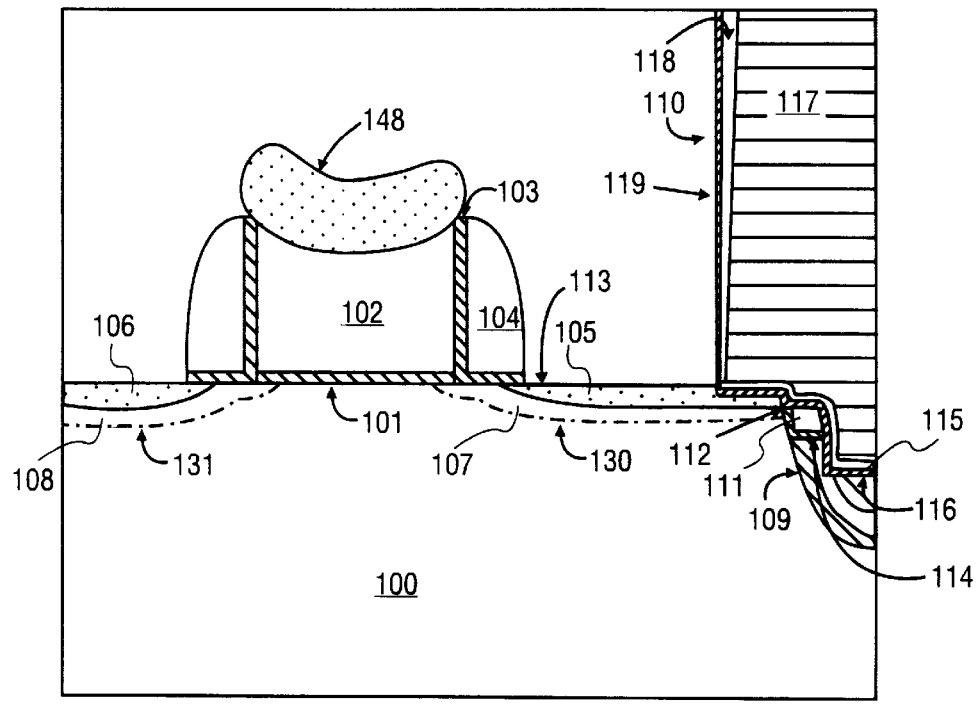
FIG. 1 is an illustration of a cross-section of a section of an embodiment of the integrated circuit of the present invention.

An improved integrated circuit and method for making it are described. FIG. 1 is an illustration of a cross-section of a section of an embodiment of the integrated circuit of the present invention that includes well 100 upon which is formed gate oxide 101 upon which rests gate 102. As shown, gate 102 comprises polysilicon and silicide 148. On the sides of gate 102 is oxide 103, which serves as a stress buffer for the nitride layer used to form nitride spacers 104. On either side of spacers 104 are conductive regions 130 and 131, which are formed on well 100. In this embodiment of the present invention, conductive regions 130 and 131 comprise suicides 105 and 106 which rest on diffused regions 107 and 108, respectively.

Also shown in FIG. 1 are shallow trench isolation structure 109 formed adjacent to well 100, borderless contact 110, which makes electrical contact to conductive region 130 through silicide 105, and insulating spacer 111 formed adjacent to sidewall 112 of conductive region 130. The embodiment shown in FIG. 1 shows insulating spacer 111 to extend below conductive region 130 so that part of insulating spacer 111 lies adjacent to well 100. As shown in FIG. 1, insulating spacer 111 contacts conductive region 130, borderless contact 110 and shallow trench isolation structure 109. In addition, surface 113 of conductive region 130 extends above surface 114 of shallow trench isolation structure 109, and portion 115 of borderless contact 110 touches portion 116 of shallow trench isolation structure 109. The term "sidewall," as used herein, is not intended to suggest that the interface between insulating spacer 111 and conductive region 130 is vertical or substantially vertical, or even that it has an incline greater than 45 degrees. "Sidewall" simply refers to the edge of conductive region 130 that contacts insulating spacer 111 without regard to any particular orientation.

Well 100 may be a heavily doped (e.g., p+ or n+) p-well or n-well, depending upon whether the device formed above well 100 is an n-MOS or p-MOS device. Gate oxide 101, gate 102, oxide 103, nitride spacers 104, silicides 105 and 106 and diffused regions 107 and 108 may be made from materials conventionally used to form such structures using conventional process steps, as is well understood by those skilled in the art. For example, oxide 103 may be formed using a plasma enhanced or furnace chemical vapor deposition process, and diffused regions 107 and 108 (which may be lightly or heavily doped regions) may be formed by various ion implantation, solid source, or other diffusion techniques.

Although conductive regions 130 and 131 shown in FIG. 1 include silicides 105 and 106 formed on diffused regions 107 and 108, any conductive structure or material that may receive borderless contact 110 may comprise a conductive region, as that term is used herein. The term "conductive region" is thus not intended to be limited to the structure shown in FIG. 1.

Shallow trench isolation structure 109 may comprise a combination of grown and deposited oxide and may be formed in numerous ways, such as using the process described in U.S. Pat. No. 5,719,085, assigned to this application's assignee. Borderless contact 110 is shown as tungsten plug 117 deposited onto titanium nitride layer 118, which in turn is formed on titanium layer 119. Although the embodiment of the present invention shown in FIG. 1 portrays borderless contact 110 as a tungsten plug, other materials may be used instead without departing from the spirit and scope of the present invention.

Insulating spacer 111 preferably comprises silicon nitride, but may alternatively be made from other materials that may act as an etch stop for the contact etch. As shown in FIG. 1, insulating spacer 111 isolates borderless contact 110 from well 100, thus performing the nitride etch stop function, but only where needed at the edge of conductive region 130. To perform that function, insulating spacer 111 preferably should be between about 500 and about 1,500 angstroms thick, as measured from top to bottom. Insulating spacer 111 should be wide enough to isolate borderless contact 110 from well 100, and preferably should be between about 300 and about 1,200 angstroms wide, as measured from sidewall 112.

Figure 2:
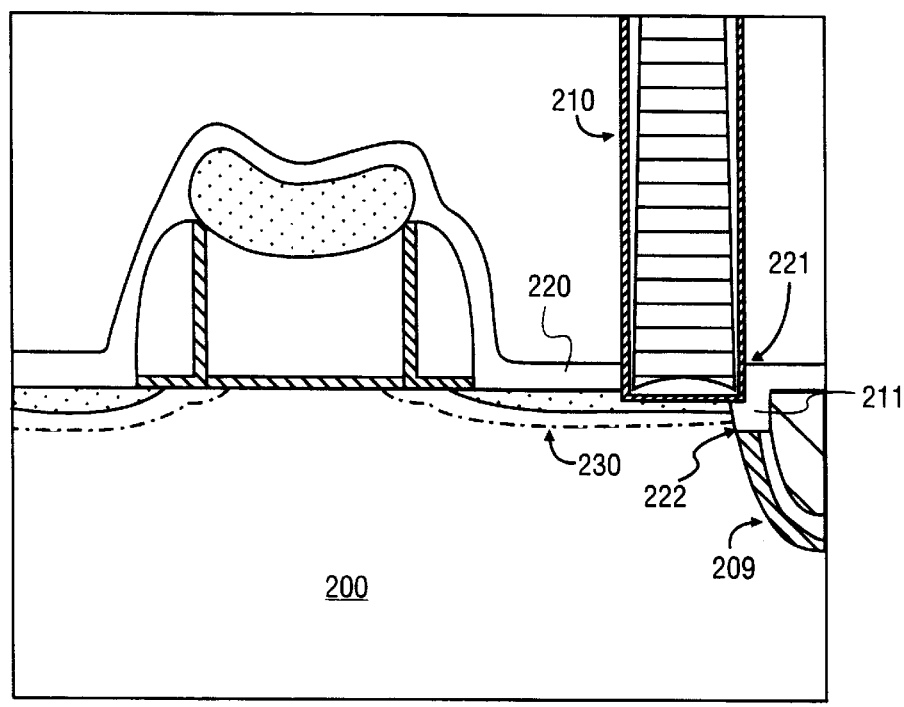
FIG. 2 is an illustration of a cross-section of a section of a second embodiment of the integrated circuit of the present invention.

FIG. 2 is an illustration of a cross-section of a section of a second embodiment of the integrated circuit of the present invention Like the embodiment shown in FIG. 1, the device shown in FIG. 2 includes shallow trench isolation structure 209, borderless contact 210, and insulating spacer 211. Unlike the embodiment shown in FIG. 1, the embodiment shown in FIG. 2 comprises a layer 220, which may comprise silicon nitride, that is formed above conductive region 230 and on the surface of shallow trench isolation structure 209. Layer 220 encircles lower portion 221 of borderless contact 210.

Extension 222 of layer 220 forms insulating spacer 211. Layer 220, where it forms insulating spacer 211, is preferably between about 600 and about 1,500 angstroms thick. Layer 220, where it appears elsewhere, is preferably between about 300 and about 1,000 angstroms thick. Layer 220, where it forms insulating spacer 211, is preferably at least twice as thick as where layer 220 covers other portions of shallow trench isolation structure 209. Insulating spacer 211 prevents borderless contact 210 from reaching well 200, thus providing the etch stop function only where it is needed at the edge of conductive region 230.

Set forth below is a description of preferred processes for making the integrated circuits described above. These descriptions are made with reference to FIGS. 3a–3d and FIGS. 4a–4d, which provide illustrations of cross-sections that reflect the structures that result after using certain steps.

Figure 3A:
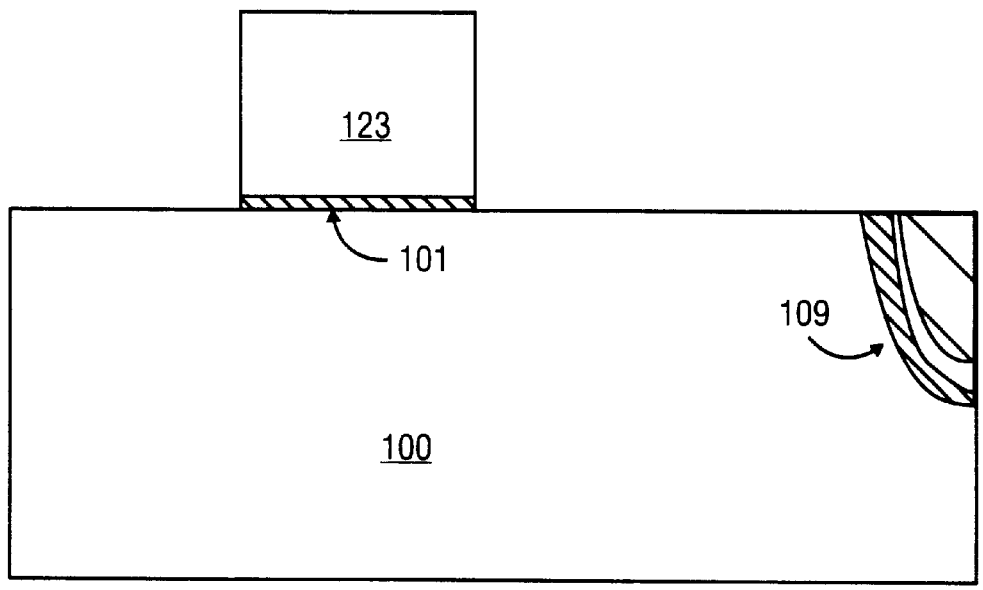
FIGS. 3a–3d are illustrations of cross-sections that reflect structures that may result after certain steps are used, when making the integrated circuit represented by FIG. 1.

To make the integrated circuit represented by FIG. 1, well 100 is formed in a semiconductor substrate. As mentioned above, well 100 may be either an n-well or a p-well, which may be made using conventional techniques. Gate oxide 101, polysilicon member 123, which will become part of gate 102, and shallow trench isolation structure 109 are then created on well 100. Those structures may be made from materials conventionally used in the art, using conventional manufacturing techniques. A cross-section of the resulting device is shown in FIG. 3a.

Figure 3B:
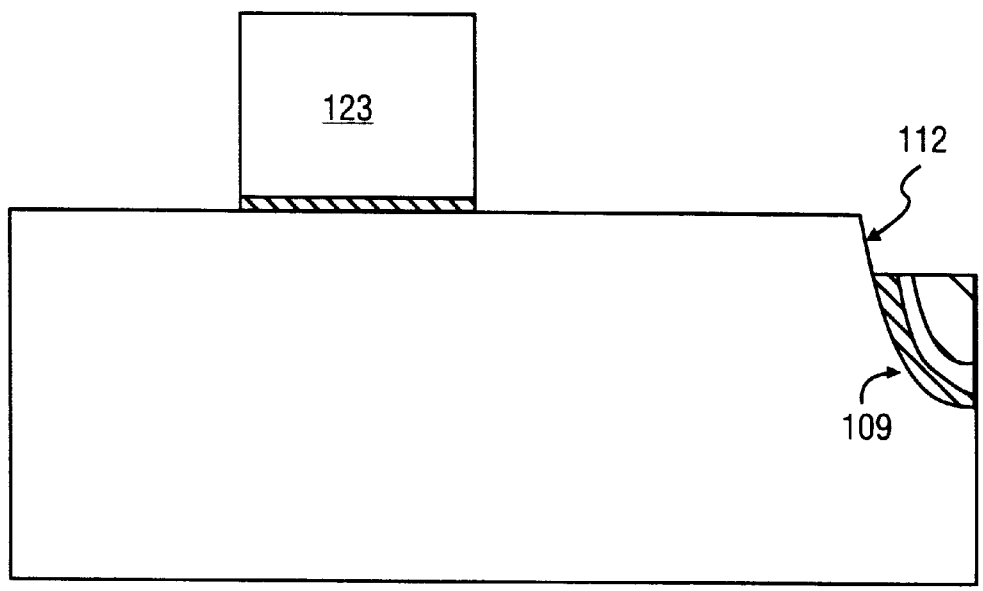

After forming shallow trench isolation structure 109 and polysilicon member 123, shallow trench isolation structure 109 is etched. Any wet or dry etch process having a substantially higher etch rate for oxide than for silicon may be used. Preferably between about 500 and about 1,500 angstroms of oxide are etched from the surface of shallow trench isolation structure 109. That etch step exposes sidewall 112, as shown in FIG. 3b. An LDD implant may be applied either before or after the oxide etch step.

About 100 to 200 angstroms of oxide 103 are then formed on the sides of polysilicon member 123. Any conventional plasma enhanced or furnace chemical vapor deposition process, e.g., a hotwall TEOS deposition process, may be used to deposit the oxide. Next, a substantially conformal layer of silicon nitride is deposited over the resulting structure. Between about 500 and about 1,500 angstroms of silicon nitride, having substantial uniformity, may be deposited using conventional process steps. In addition to covering polysilicon member 123, the deposited nitride layer will cover shallow trench isolation structure 109 and sidewall 112.

Figure 3C:
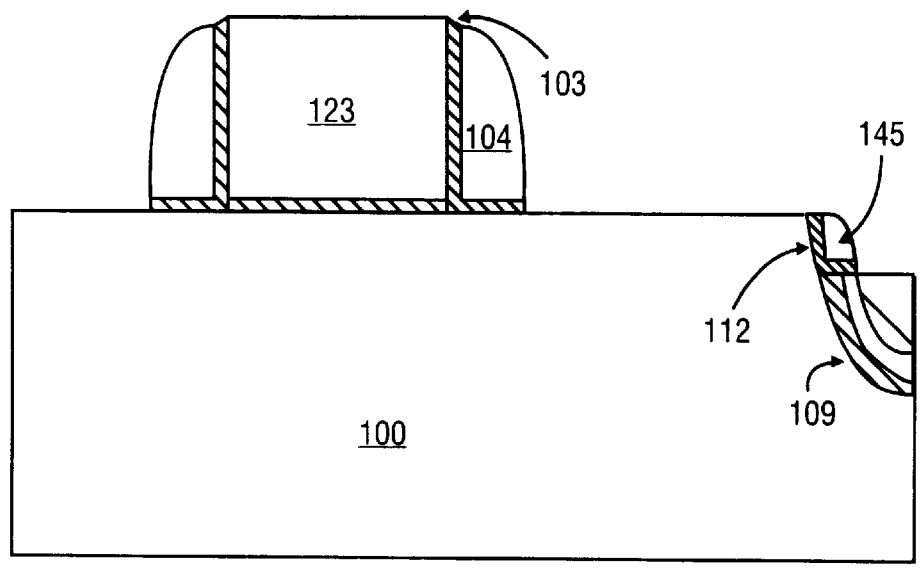

Following the nitride deposition step, the nitride is anisotropically etched. In addition to creating nitride spacers 104 on the sides of polysilicon member 123, the nitride etch step creates nitride spacers 145 on the sidewalls bordering shallow trench isolation structure 109, such as on sidewall 112. Similarly, a thin layer of oxide is deposited along the sidewall 112 in addition to being deposited on the sides of polysilicon member 123. Nitride spacer 145, which results from anisotropically etching the silicon nitride layer, is preferably between about 500 and about 1,500 angstroms thick, as measured from top to bottom. Nitride spacer 145 should be wide enough to isolate borderless contact 110 (which will be formed in a later process step) from well 100. Nitride spacers 104 should be wide enough to prevent spaced source/drain implants from diffusing too far under the gate. Nitride spacers 104 and 145 preferably are between about 300 and about 1,200 angstroms wide, as measured from oxide 103 and sidewall 112, respectively. FIG. 3c shows the structure that the nitride etch step generates.

After the nitride etch step, ions are implanted and/or thermal steps are applied to introduce dopants into the substrate to form diffused regions 107 and 108. Following that doping step, a layer of titanium, cobalt or another metal is deposited, then subjected to thermal treatment and an etch step to form silicides 105 and 106. A dielectric layer 125 is then deposited on top of the resulting structure, which may be etched back or planarized, such as by applying a chemical mechanical polishing step.

Figure 3D:
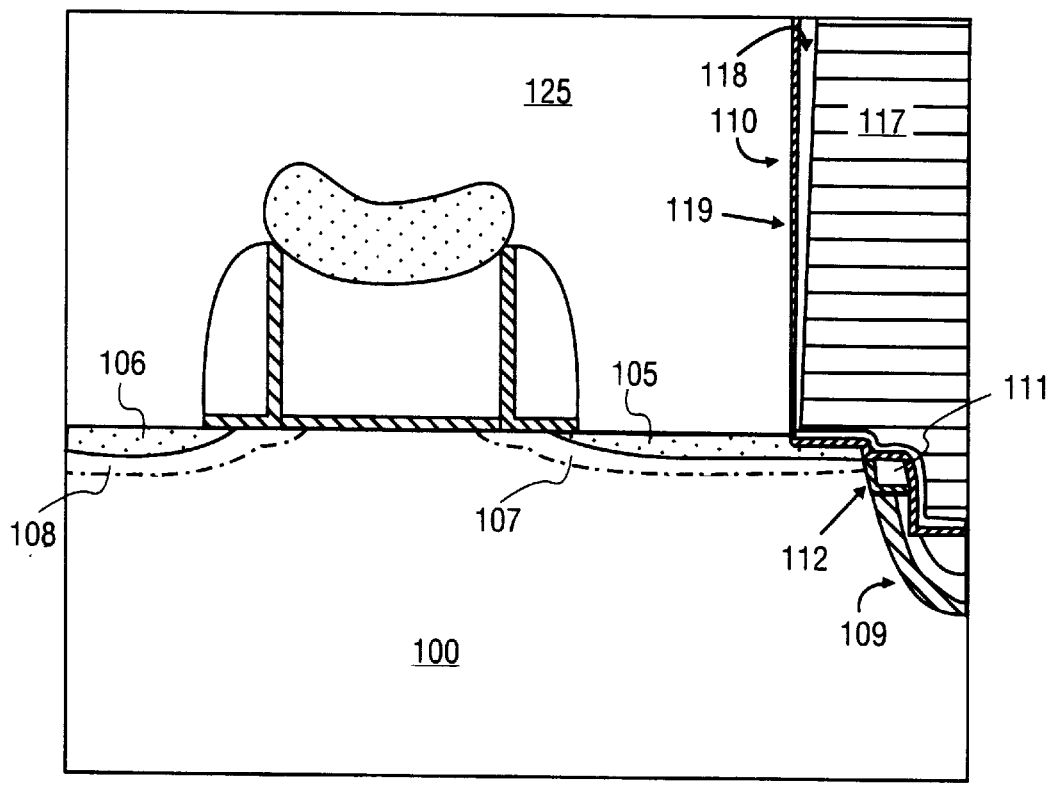

Next, a conventional contact etch step may be applied to form a via that extends through dielectric layer 125 to silicide 105 and also into shallow trench isolation structure 109. Although the contact etch will remove portions of structure 109, that etch step will not remove sections of structure 109 that are adjacent well 100 because insulating spacer 111 acts as an etch stop to prevent that effect. After the etch step, relatively thin titanium and titanium nitride layers 119 and 118 may be deposited followed by depositing tungsten plug 117 to form borderless contact 110. FIG. 3d shows the structure that results after the contact formation step.

This process for making the integrated circuit represented by FIG. 1 may provide a number of advantages over processes that deposit a nitride layer after silicide formation to serve as an etch stop. Because nitride spacer 145 and nitride spacers 104 are formed in the same step, there is no additional nitride layer deposition step. In addition, unlike a process that deposits a nitride layer over the entire substrate, the process described above enables a single step contact etch as it does not require a nitride layer to be etched after etching through dielectric layer 125. Eliminating additional nitride deposition and etching steps, which otherwise may be required, should reduce the time necessary to process each wafer, which should ensure higher throughput.

Another advantage of this new process is that nitride spacer 145 is formed before the silicide. Consequently, high quality furnace nitride may be used to form nitride spacer 145. In contrast, when a nitride layer is deposited after silicide formation, lower temperature processes must be used, which may adversely affect device reliability.

Figure 4A:
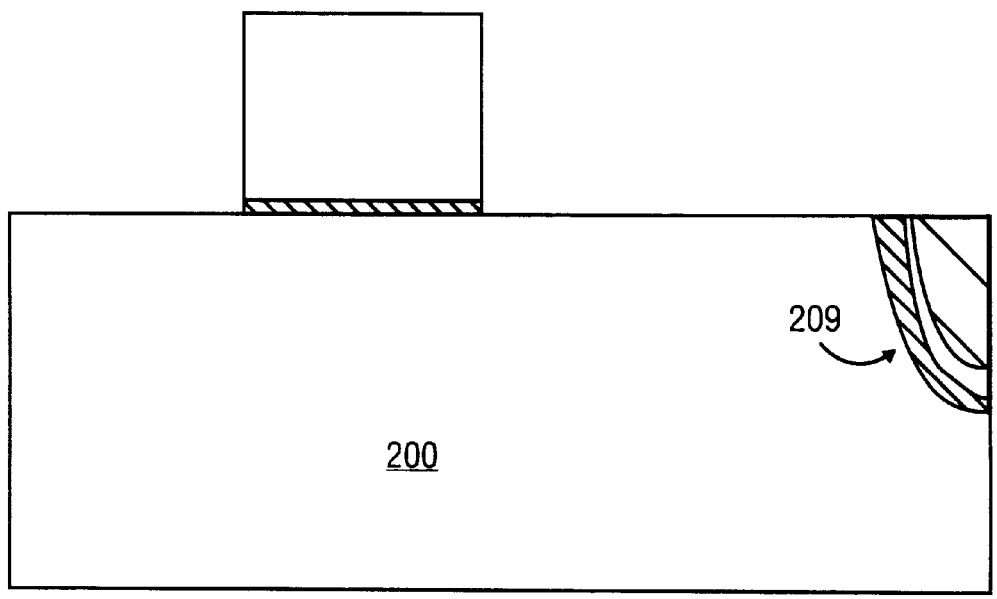
FIGS. 4a–4d are illustrations of cross-sections that reflect structures that may result after certain steps are used, when making the integrated circuit represented by FIG. 2.

To make the integrated circuit represented by FIG. 2, shallow trench isolation structure 209 is formed, as shown in FIG. 4a. Subsequently, conventional processing may be used up through the silicide formation step, in which silicides 205 and 206 are formed on top of diffused regions 207 and 208. Those conventional process steps may produce recess 241 where shallow trench isolation structure 209 meets conductive region 230. Recess 241 may result from cleaning steps that remove oxide at a higher rate at high stress points, such as where shallow trench isolation structure 209 meets conductive region 230. Cleaning steps that apply a buffered oxide etch (e.g., an etch performed by dipping a wafer in an HF/NH$_4$F containing solution, which may also include a surfactant) may generate recess 241.

Figure 4B:
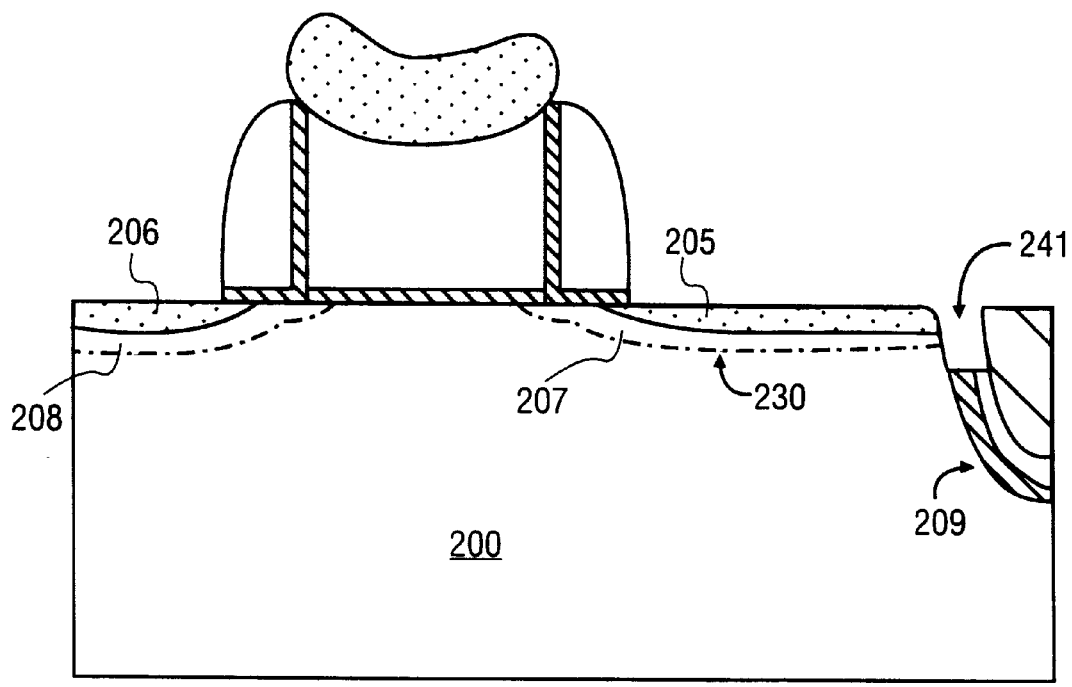

In this embodiment of the present invention, recess 241 must be sufficiently deep to receive an insulating spacer 211 that is sufficiently thick to perform an etch stop function for the contact etch. If the cleaning steps performed through the silicide etch step do not create a sufficiently deep recess, then an additional buffered oxide etch step may be added to the process. Preferably, that step comprises dipping the wafer in a HF/NH$_4$F containing solution, which optionally may include a surfactant, for about 10 minutes or less, and preferably for 5 or 6 minutes. The resulting recess 241 preferably is sufficiently narrow that a subsequently deposited nitride layer can fill recess 241 without causing that nitride layer to have an uneven surface where it covers recess 241. The recess 241 containing structure, as it appears after the silicide formation step, is shown in FIG. 4b.

Figure 4C:
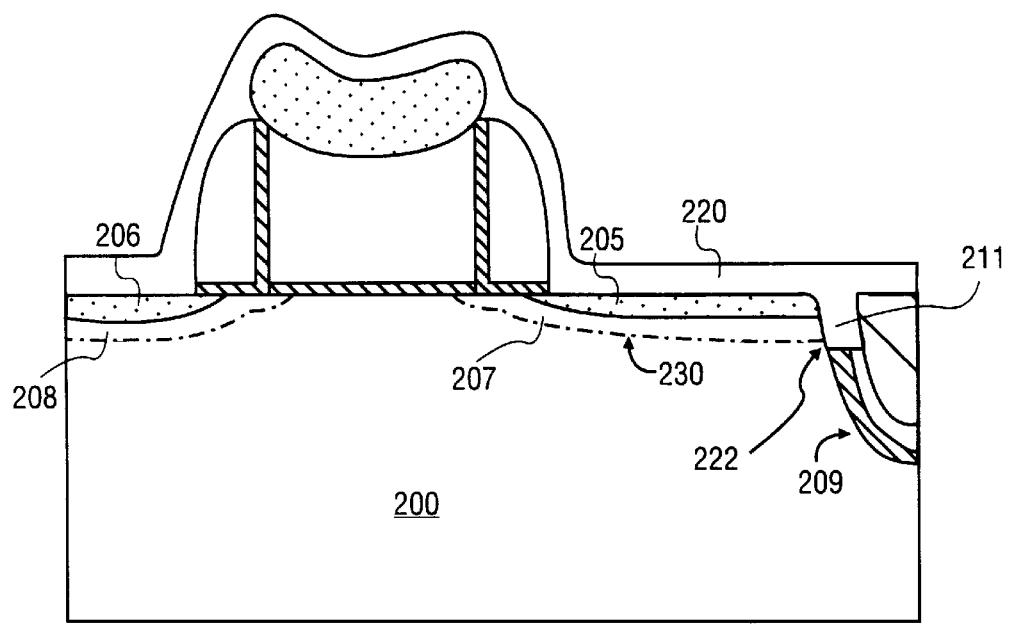

After silicides 205 and 206 and recess 241 are formed, layer 220 is formed on the surface of the resulting structure. Layer 220 preferably comprises silicon nitride, which may be deposited onto silicides 205 and 206 and shallow trench isolation structure 209 using conventional techniques for forming a nitride etch stop layer for a borderless contact. As shown in FIG. 4c, the resulting layer 220 includes extension 222, which fills recess 241 to create insulating spacer 211.

Because layer 220 is relatively thick where extension 222 forms insulating spacer 211 at the side of conductive region 230, other portions of layer 220 can be thinner than otherwise may be necessary to produce an etch stop layer for the contact etch. In this embodiment of the present invention, layer 220 preferably is between about 300 and about 1,000 angstroms thick where it covers silicides 205 and 206 and shallow trench isolation structure 209, and preferably is between about 600 and about 1,500 angstroms thick where it fills recess 241. Layer 220, where it forms insulating spacer 211, is preferably at least about twice as thick as where it covers silicides 205 and 206 and shallow trench isolation structure 209. Such a relatively large difference in thickness is not required, however, as this embodiment of the present invention contemplates employing any layer that is significantly thicker where it forms insulating spacer 211 than elsewhere.

Figure 4D:
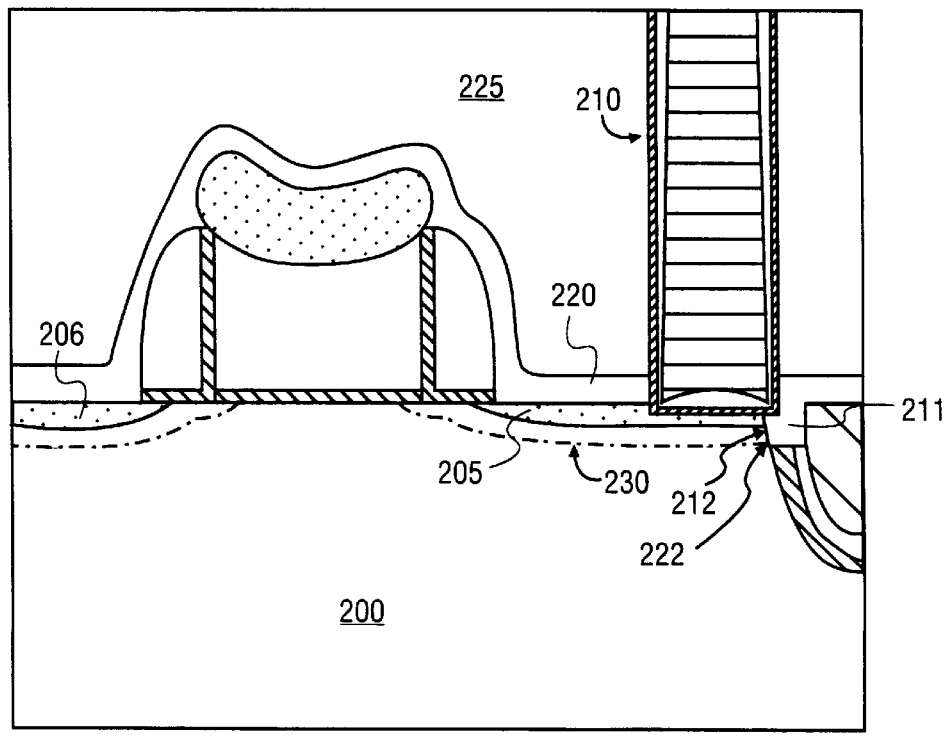

After the silicon nitride deposition step, dielectric layer 225 is formed on top of that layer. A two step etch is then performed to etch the via for the contact. The first step etches through dielectric layer 225; the second step etches through layer 220. Borderless contact 210 is then formed to make electrical contact to conductive region 230, e.g., by contacting silicide 205, as shown in FIG. 4d. In the resulting device, layer 220 includes extension 222 for forming relatively thick insulating spacer 211, where needed to isolate borderless contact 210 from well 200, but otherwise is relatively thin. As shown in FIG. 4d, insulating spacer 211 may perform an etch stop function in addition to insulating borderless contact 210 from well 200.

By forming a relatively thick layer only where needed, and forming a relatively thin layer elsewhere, borderless contacts can be isolated from the well, while the decreased spacing beween devices, which borderless contacts provide, may be preserved.

Features shown in the above referenced drawings are not intended to be drawn to scale, nor are they intended to be shown in precise positional relationship. For example, borderless contact 110 could be formed further to the left from the position shown in FIG. 1, and could be formed further to the right from the position shown in FIG. 2. Additional process steps that may be used to make the embodiments described above have been omitted when not useful to describe aspects of the present invention.

Although the foregoing description has specified an integrated circuit that includes certain features, and has specified certain materials and process steps for making such an integrated circuit, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. An integrated circuit comprising:

a shallow trench isolation structure formed adjacent to a well;

a borderless contact making electrical contact to a conductive region formed on the well; and a layer of silicon nitride formed on the conductive region and the shallow trench isolation structure that encircles a lower portion of the borderless contact and wherein an extension of that layer of silicon nitride forms an insulating spacer adjacent to a sidewall of the conductive region.

2. The integrated circuit of claim 1 wherein the silicon nitride layer is between about 600 and about 1,500 angstroms thick where it forms the insulating spacer, and between about 300 and about 1,000 angstroms thick where it covers other portions of the shallow trench isolation structure.

3. The integrated circuit of claim 1 wherein the insulating spacer contacts the conductive region and the well.

4. A method of forming an integrated circuit comprising:

forming a shallow trench isolation structure;

forming a gate oxide and a polysilicon member that are spaced from the shallow trench isolation structure;

forming a conductive region adjacent to the shallow trench isolation structure, wherein a recess is etched into a corner of the shallow trench isolation structure where the shallow trench isolation structure meets the conductive region; then depositing a layer of silicon nitride to fill the recess to form an insulating spacer on the shallow trench isolation structure and to cover the polysilicon member and other portions of the shallow trench isolation structure; and forming a borderless contact that makes electrical contact to the conductive region.

5. The method of claim 4 wherein the silicon nitride layer formed from the silicon nitride layer deposition step is between about 300 and about 1,000 angstroms thick where it covers other portions of the shallow trench isolation structure, and is between about 600 and about 1,500 angstroms thick where it fills the recess, and wherein the silicon nitride layer, where it forms the insulating spacer, is at least about twice as thick as the silicon nitride layer where that layer covers other portions of the shallow trench isolation structure.

6. The method of claim 4 wherein the conductive region contacts the insulating spacer.

7. The method of claim 6 wherein the insulating spacer contacts a well located below the conductive region.

8. A method of forming an integrated circuit comprising:
   forming a shallow trench isolation structure adjacent to a well;
   forming a gate oxide and a polysilicon member that are spaced from the shallow trench isolation structure;
   etching the shallow trench isolation structure;
   depositing a layer of silicon nitride onto the polysilicon member and the etched shallow trench isolation structure;
   anisotropically etching the layer of silicon nitride to simultaneously form a silicon nitride spacer on a sidewall of the polysilicon member and a silicon nitride spacer on a sidewall of a conductive region formed on the well; and
   forming a borderless contact that makes electrical contact to the conductive region.

9. The method of claim 8 wherein between about 500 and about 1,500 angstroms is etched from the surface of the shallow trench isolation structure prior to depositing a layer of silicon nitride that is between about 500 and about 1,500 angstroms thick onto the surface of the etched shallow trench isolation structure, and wherein the silicon nitride spacer that is formed on a sidewall of the conductive region is between about 500 and about 1,500 angstroms thick and between about 300 and about 1,200 angstroms wide.

* * * * *

UNITED STATES PATENT AND TRADEMARK OFFICE
CERTIFICATE OF CORRECTION

PATENT NO. : 6,294,823 B1
DATED : September 25, 2001
INVENTOR(S) : Arafa et al.

It is certified that error appears in the above-identified patent and that said Letters Patent is hereby corrected as shown below:

<u>Column 2,</u>
Line 10, delete "suicides", insert -- silicides --.

Signed and Sealed this

Twenty-eighth Day of May, 2002

Attest:

JAMES E. ROGAN
*Attesting Officer*     *Director of the United States Patent and Trademark Office*